United States Patent [19]
Chirovsky et al.

[11] Patent Number: 5,667,132
[45] Date of Patent: Sep. 16, 1997

[54] METHOD FOR SOLDER-BONDING CONTACT PAD ARRAYS

[75] Inventors: Leo Maria Freishyn Chirovsky, Bridgewater; Lucian Arthur D'Asaro, Madison; Donald William Dahringer, Glen Ridge; Sanghee Park Hui, New Providence; Betty Jyue Tseng, Berkeley Heights, all of N.J.

[73] Assignee: Lucent Technologies Inc., Murray Hill, N.J.

[21] Appl. No.: 633,992

[22] Filed: Apr. 19, 1996

[51] Int. Cl.$^6$ ........................................ H05K 3/32
[52] U.S. Cl. .................. 228/180.22; 228/193; 228/106; 228/265
[58] Field of Search ................ 228/106, 180.22, 228/193, 265, 180.21

[56] References Cited

U.S. PATENT DOCUMENTS

| | | | |
|---|---|---|---|
| 3,555,664 | 1/1971 | Bingham et al. | 228/180.22 |
| 3,561,107 | 2/1971 | Best et al. | 228/180.21 |
| 3,591,839 | 7/1971 | Evans | 228/180.22 |
| 4,332,341 | 6/1982 | Minetti | 228/193 |
| 4,739,917 | 4/1988 | Baker | 228/248.1 |

OTHER PUBLICATIONS

K.W. Grossen et al., "GaAs MQW Modulators Integrated with Silicon CMOS", *IEEE Photonics Technology Letters*, vol. 7, No. 4, pp. 360–362 (1995).

Primary Examiner—Samuel M. Heinrich
Attorney, Agent, or Firm—Robert E. Rudnick

[57] ABSTRACT

Solder bonding of first and second contact pad arrays is accomplished by forming contact structures, such as posts with vertical or tapered sides, on the contact pads of the first array and solder bumps on the second array. The respective contact structures should have an average cross-sectional area that is less than the average cross-sectional area of the corresponding solder bumps. The contact structures and solder bumps are then bonded by a bonding process at a temperature and pressure where the solder bumps deform and envelop at least a portion of the respective contact structures. It is possible to employ the contact structures as a compression stop during the bonding process. The temperature should be below the melting points of the contact structures. In this manner, solder bump spreading can be reduced during bonding which correspondingly reduces electrical shorting of adjacent formed interconnect bonds.

15 Claims, 2 Drawing Sheets

METHOD FOR SOLDER-BONDING CONTACT PAD ARRAYS

FIELD OF THE INVENTION

The invention relates to bonding electrical components in general and more particularly to solder bonding of arrays of contact pads of such components.

BACKGROUND OF THE INVENTION

A common method for establishing connections between electrical components is solder bonding. Semiconductor chips are often joined to a printed circuit board (PCB) or each other in this manner. One typical solder bonding technique for soldering aligned arrays of contact pads on respective components includes the formation of similar bumps of solder on the contact pads of each array. The respective components are then arranged with the solder bumps oriented butt-to-butt and subjected to cycles of heat and pressure in a liquid or gaseous flux which melts the solder bumps to form the respective interconnections between the contact pad arrays.

However, conventional solder bump bonding is very difficult for contact pad arrays extending over large substrate areas, such as on the order of 5 mm×5 mm, wherein at least a region of the array contains closely spaced contact pads, such as less than 25 μm between contact pad edges. In such bonding applications, it is difficult to align component surfaces containing the contact pads of the respective arrays exactly parallel to one another while applying bonding pressure. As a consequence, solder bumps in particular regions receive more bonding pressure then solder bumps in other regions. Such unbalanced pressure often causes excessive spreading of the solder bumps in the regions receiving more pressure resulting in electrical shorting between laterally adjacent contact pads.

In contact pad arrays employing larger pad separations, dam-like structures have been used around the contact pads to limit the expansion of the solder bumps during bonding. However, the use of such structures undesirably increases fabrication cost and complexity. Moreover, such structures are difficult to implement in closely spaced contact pad arrays such as those having separations of less than 25 μm.

Also, conventional solder-bump bonding techniques present specific problems for joining contact pad arrays disposed on substrates having different coefficients of thermal expansion. Such problems arise when the substrates are subjected to the elevated temperatures used to melt the solder bumps. These temperatures often cause the substrates to expand by different respective amounts and upon cooling tend to break the solder bond junctions. Such breakage problems increase with reduced contact pad size and/or increased substrate size.

Thus, a need exists for a high yield solder bonding technique that enables bonding of large arrays of closely spaced contact pads and that is useful for joining contact pad arrays on substrates with different coefficients of thermal expansion.

SUMMARY OF THE INVENTION

A novel and unobvious technique for limiting the spreading of solder bumps during bonding of first and second contact pad arrays is to employ contact structures, such as gold posts with vertical or tapered sides, on the contact pads of the first array and solder bumps on the second contact pad array. The arrays are bonded by a thermo-compression bonding process that achieves a temperature below the melting point of the contact structures where the solder bumps are deformable relative to the contact structures, and a pressure such that the solder bumps deform and envelop at least a portion of the respective contact structures. The enveloped portion of the respective contact structures should have an average cross-sectional area in a plane parallel to the array that is less than the corresponding average cross-sectional area of the respective solder bumps. The smaller average cross-sectional areas of the contact structures limits the amount of solder displacement from the solder bumps. As a consequence, a reduction in solder bump spreading is achieved which results in a corresponding reduction in electrical shorting between adjacent contact pad bonds.

The limited solder bump spreading produced by this technique is less sensitive to excessive pressure as a result of unbalanced bonding compression across the arrays. Accordingly, the invention is particularly useful for bonding contact pad arrays extending over relatively large areas. For instance, it is possible to use the invention to bond contact pads with dimensions on the order of 10 μm×10 μm with a spacing of 10 μm between contact pad edges with array densities on the order of 10,000 contact pads.

The solder bumps should have a lower melting point temperature than the contact structures. Although bonding temperatures between the melting points of the solder bumps and contact structures can be used with the invention, it is also possible to use bonding temperatures below the melting point of the solder bumps. At such temperatures, bonding can advantageously be performed without the use of flux.

In an exemplary embodiment of the invention, the contact structures have a height less than the height of the solder bumps. Such height differences enable the contact structures to be used as a compression stop during bonding. Accordingly, such a configuration provides ease of assembly and substantially prevents over squeezing in particular areas as well as limits solder bump spreading to an amount which can be predetermined.

During bonding, the solder bump deformation can include a ripping and penetration of respective surfaces of the solder bumps by the contact structures. Such penetration advantageously exposes the contact structures to fresh, substantially uncontaminated metallic solder material within the solder bumps when forming the interconnect bonds. As a result, the invention substantially reduces the likelihood of an electrical open circuit or failed electrical connection between the contact structures and solder bumps.

Moreover, since the bonding process can be performed at relatively lower temperatures, i.e., temperatures below the melting points of the solder bumps and the contact structures, the invention is well suited for those applications where the substrates possess different coefficients of thermal expansion, such as in bonding GaAs integrated circuits to silicon integrated circuits. The lower temperatures limit the resulting differences in thermal expansion of the electrical components which reduces the likelihood of interconnect breakage due to expansion stresses.

Additional features and advantages of the present invention will become more readily apparent from the following detailed description and accompanying drawings.

DETAILED DESCRIPTION

The invention is based on the discovery that during bonding, electrical shorting between laterally adjacent interconnect bonds can be substantially reduced by employing contact structures, such as posts, on one contact pad array for mating with solder bumps on an opposing aligned contact pad array. The bonding process should be performed at a temperature below the melting point of the contact structures where the solder bumps are deformable relative to the contact structures, and at a pressure where the solder bumps deform and envelop at least a portion of the respective contact structures. The enveloped bonding portions of the respective contact structures should have an average cross-sectional area in a plane parallel to contact pad array that is less than the corresponding average cross-sectional area of the respective solder bumps.

The solder bumps should have a lower melting point temperature than the contact structures. Although bonding temperatures between the melting points of the solder bumps and contact structures can be used with the invention, it is also possible to use bonding temperatures below the melting point of the solder bumps. At such temperatures, bonding can advantageously be performed without the use of flux.

The smaller average cross-sectional area of the contact structures limits the amount of solder displacement for the solder bumps resulting in a reduction of solder bump spreading and correspondingly, lateral shorting between interconnect bonds. For instance, by employing contact structures having average cross-sectional areas that are 25% to 50% of the average cross-sectional areas of the corresponding solder bumps, it is possible to bond contact pads having dimensions on the order of 10 μm×10 μm with a spacing between contact pad edges of approximately 10 μm and array densities on the order of 10,000 contact pads.

Since the bonding process can be performed at relatively low temperatures, i.e., temperatures below the melting points of the solder bumps and contact structures, any differences in the thermal expansions of the contact pad array substrates would likewise be limited. As a consequence, the likelihood of interconnect bond breakage due to expansion stresses would be reduced. Accordingly, the invention is described with respect to the bonding of contact pad arrays on exemplary substrates of gallium arsenide (GaAs) and silicon having different coefficients of thermal expansion. However, it should be readily understood that such an arrangement is for illustration purposes only and that the invention is also useful for substrates having similar or the same coefficients of thermal expansion as well as for non-semiconductor substrates including fiber-glass or polyimide printed circuit boards (PCBs) and plastic or ceramic component packages.

Figure 1:
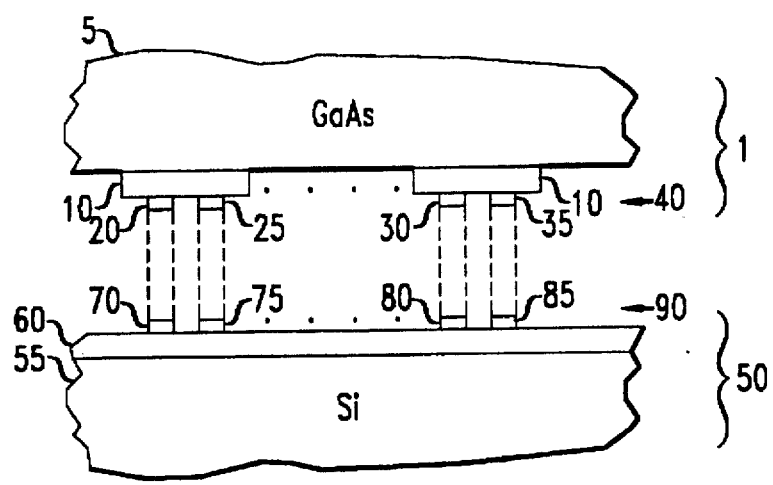
FIGS. 1–3 illustrates a schematic block diagram of exemplary integrated circuit chips at various stages of bonding in accordance with the invention.
Figure 2:
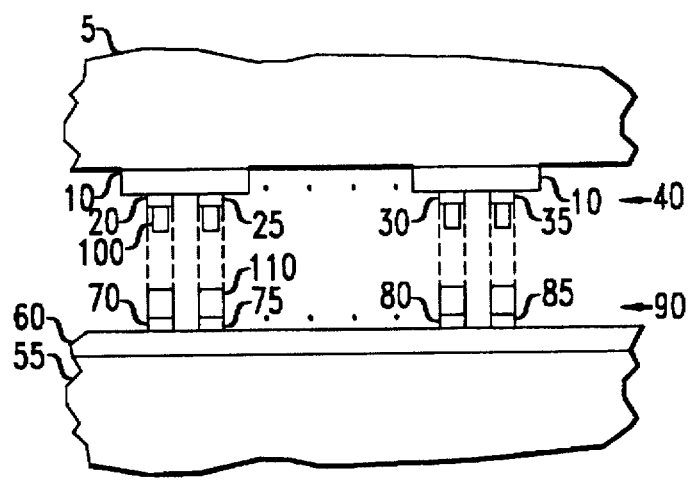
Figure 3:
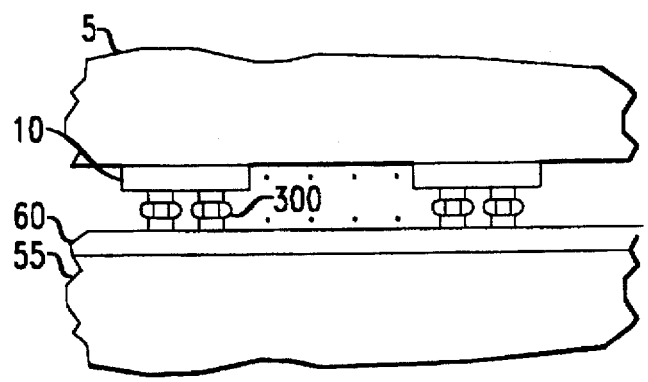

FIG. 1 depicts a portion of a first electrical component such as an optoelectronic integrated circuit chip 1 that is to be connected in a flip chip arrangement to a second electrical component, such as an integrated circuit chip 50. The optoelectronic integrated circuit chip 1 includes a GaAs substrate 5 containing an array of optical devices 10, such as optical modulators. The integrated circuit 50 includes a silicon substrate 55 having a layer of complementary metal-oxide-semiconductor (CMOS) circuitry 60 disposed thereon. The details of the circuit configurations of the CMOS circuitry 60 is not critical to practicing the invention and have not been shown in FIG. 1 for ease of illustration. An integration of GaAs and Si CMOS circuits, such as that depicted in FIGS. 1–3, is described in greater detail in K. W. Grossen et al., "GaAs MQW Modulators Integrated With Silicon CMOS", *IEEE Photonics Technology Letters*, Vol. 7, No. 4, pp. 360–362 (April 1995), which is incorporated by reference herein.

The optical modulators 10 of the GaAs integrated circuit chip 1 possess matching arrays of contact pad pairs including respective pairs of contact pads 20 and 25, and 30 and 35 which are collectively referred to as 40. Exemplary dimensions for the contact pads 40 can be in the approximate range of 10 μm×10 μm to 20 μm×20 μm with the spacing between contact pads 40 of a pair, such as contact pads 20 and 25, being in a corresponding approximate range of 10 μm×10 μm. The drawings have not been drawn to scale and the distances between the respective depicted contact pad pairs, such as between pairs 20 and 25 and 30 and 35 can be on the order of several millimeters or larger. Moreover, in accordance with the invention, it is also possible to employ contact pads of different sizes arranged in other than pairs having larger or smaller separations.

The contact pads 40 enable an electrical signal to be applied to the devices 10. The contact pads 20 and 25, and 30 and 35 are arranged to align with mating contact pads 70 and 75, and 80 and 85, respectively, of the silicon integrated circuit 50 which are collectively referred to by 90. After formation of the interconnect bonds between the respective pads 40 and 90, electrical signals from the CMOS circuitry 60 can be transmitted to the photodevices 10 to modulate optical signals conveyed to, or originating from, the photodevices 10. In the alternative, if the photodevices 10 include a photodetector, then an electrical signal generated by the devices 10 in response to a detected optical signal can be transmitted to the CMOS circuitry 60 via the formed interconnect bonds.

The particular materials used for the respective contact pads 40 and 90 are not critical to practicing the invention. However, single or multiple-layer structures can be used for the contact pads 40 and 90. For instance, it is possible to use a multi-layer structure for the contact pads 90 including an aluminum layer typically employed in conventional CMOS integrated circuits, with overlaying layers of titanium (Ti), nickel (Ni) and gold (Au) having respective thickness of approximately 25 nm, 50 nm and 300 nm. In a similar manner, it is possible to employ a multi-layer contact pad 40 including layers of titanium, platinum and gold over a layer of a conventional alloy layer of gold and germanium (Ge) or gold and beryllium (Be). Whether single or multi-layer contact pads are used, such pads can be formed by conventional evaporation techniques, such as by e-beam evaporation or sputtering with the pads being defined using a conventional photolithographic technique.

FIG. 2 depicts the electrical components 1 and 50 of FIG. 1 with added bonding structures 100 and 110 in accordance with the invention. In particular, prior to bonding, contact structures 100, such as gold posts, are formed on the respective contact pads 40 of the GaAs integrated circuit 1 and solder bumps 110 are formed on the respective contact pads 90 of the silicon integrated circuit 50. It is alternatively possible to form the contact structures 100 on the contact pads 90 and the solder bumps 110 on the contact pads 40 in accordance with the invention.

The particular materials used for the contact structures 100 and solder bumps 110 should be selected such that the solder bumps 110 are deformable relative to the contact structures 100 at a temperature achieved by the bonding process. Exemplary contact structure materials include, for example, gold, platinum, palladium and alloys of platinum and palladium. If gold posts are used for the contact structures 100, then conventional solder materials such as tin (Sn), gold-plated tin, lead/tin (Pb/Sn), indium (In) and Pb/Sn-based alloys can be used for the solder bumps 110. During bonding, sufficient pressure and temperature is applied to the substrates 1 and 50 such that the respective solder bumps 110 deform and envelop at least a portion of the respective contact structures 100 as shown in FIG. 3 which is described in detail below.

The portions of the contact structures 100 to be enveloped by the solder bumps 110 are referred to as bonding portions. These bonding portions should have a respective average cross-sectional area that is less than the average cross-sectional area of the corresponding respective solder bumps 110 in accordance with the invention. The use of contact structures 100 having bonding portions with average cross-sectional areas that are less than approximately 60% of the average cross-sectional areas of the corresponding solder bumps can limit solder spreading to within half the distance between contact pads where a dimension of the contact pads are on the order of the separation distances between contact pads. Thus, for example, contact structures with cross-sectional areas of 60 µm$^2$ to 100 µm$^2$ for solder bumps with a typical cross-sectional area of 200 µm$^2$ to 400 µm$^2$ can limit solder bump spreading to within 50% of the distance between adjacent contact pad edges when such distance is in the range of 15 µm to 20 µm. It is further advantageous to employ contact structure bonding portions having an average cross-sectional area that is approximately 25% to 50% of that of the solder bumps 100.

An exemplary technique for forming gold posts for the contact structures 100 is to successively deposit thicknesses of gold on the order of 400 nm on the contact pads 40 using patterned photoresist material and an e-beam evaporation technique. A patterned photoresist with openings over the contact pads can be used to confine the deposition of the gold to the post area over the contact pads and avoid deposition in regions outside of such areas. However, in order to avoid cross-linking of the photoresist by the heat generated by the e-beam evaporation, the integrated circuit 1 and contact pads 40 are permitted to cool to a temperature of approximately 60° C. or less between successive depositions which typically requires approximately 20 to 30 minutes. The successive depositions and cooling cycles should be continued until the desired height of the gold post contact structure is achieved. Other techniques for forming the contact structures include electroless plating and sputtering.

An exemplary technique for forming the corresponding solder bumps 110 includes (a) deposition of a relatively thick layer of photoresist, such as on the order of 10 µm to achieve a corresponding solder bump thickness approximately 7 µm and preferably less than 3 µm; (b) photolithographic pattern exposure for defining opening in which the solder bumps are to be formed; (c) development to produce the solder bump openings; (d) deposition of the solder; and (e) lift-off of the photoresist, leaving formed solder bumps. The formation of an undercut or reentrant photoresist profile is also advantageous to achieve improved lift-off with high solder bump yields.

To achieve such a profile with a relatively thick photoresist, it is possible to employ photoresist No. STR1075, manufactured by Shipley Company, Marlborough, Mass., (Shipley) which when spun at an approximate rate of 2500 rpm produces a 10 µm film on a target surface. The photoresist film is then soft baked at 90° followed by a soak in Microposit 319 developer, also manufactured by Shipley, for approximately 40 seconds. After conventional pattern exposure, the photoresist film is soaked in the same developer which produces a reentrant profile in the thick photoresist. This solder bump formation technique is capable of producing solder bumps having dimensions less than 10 µm×10 µm with a thickness of approximately 7 µm or less.

In accordance with the invention, the contact pad arrays with the respective contact structures 100 and solder bumps 110, shown in FIG. 2, are then aligned and brought together under pressure in a thermo-compression bonding step to form the component assembly shown in FIG. 3. FIG. 3 depicts a cross-sectional view of the formed contact structure-solder bump interconnects. However, in practice, the portion of contact structure 100 enveloped by the solder bump 110 would not be visible.

It is possible to employ temperatures of approximately 60° C. to 90° C. less than the melting point of the solder bumps 110. For instance, if tin solder bumps and gold contact structures are used, bonding step temperatures that do not exceed tin's melting point temperature of 232° C. can be used. The temperatures achieved during bonding should also cause the solder bumps 110 to deform relative to the contact structures 100 as the integrated circuits 1 and 50 are compressed. The deformation causes solder to be displaced substantially outwardly away from the contact structures 100 as shown by bowed outer surface 300. Moreover, at such a temperature, the contact structures 100 should not substantially deform relative to the solder bumps 110. The bonding step should also be performed at a pressure to cause the solder bumps 110 to envelop at least a sufficient portion of the contact structures 100 to provide a desired bond strength. An exemplary temperature for use in bonding tin solder bumps to gold contact structures is in the approximate range of 140° C. to 170° C.

During bonding, the solder bump deformation can include a ripping and penetration of the surface of the solder bumps 110 by the contact structures 100. Such penetration advantageously exposes the contact structures 100 to fresh, substantially uncontaminated metallic solder material in the solder bumps 110 in forming the interconnect bonds. As a result, the invention substantially reduces the likelihood of an electrical open circuit or failed electrical connection between a contact structure 100 and a solder bump 110 during bonding.

Also, during bonding, it is possible to apply sufficient pressure to partially or fully press the contact structures 100 into the solder bumps 110. Accordingly, it is possible to press the contact structures 100 into the solder bumps 110 until adequate resistance to motion occurs as the contact structures 100 are substantially pressed against the contact pads 50. In this manner, the contact structures 100 are used as a stop during the bonding process. Such a configuration with the contact structures 100 fully pressed into the solder bumps 100 is advantageous because a relatively large contact area is provided between the contact structures 100 and the solder bumps 110 in the formed interconnect bonds. This increased contact area produces interconnect bonds with improved strength and electrical conductivity. An exemplary pressure for use in bonding tin solder bumps to gold contact structures is in the approximate range of 5 mg/µm$^2$ to 7 mg/µm$^2$ based on the cross sectional areas of the contact structures 100. However, it is also possible to practice the invention with the contact structures 100 extending partially into the solder bumps 110.

Moreover, it is further advantageous to employ contact structures 100 having a relative height that is less than the height of the solder bumps 110. Such a configuration further reduces solder displacement during bonding and correspondingly solder bump spreading. Also, in this manner, the contact structures 100 can be fully enveloped by the solder bumps 110 such that a portion of the solder bumps 110 also touch the contact pads 50 outside of the area of the contact structures 100, as shown in FIG. 3. Such a configuration further increases the bond contact area for even more improved electrical conductivity and bond strength. Accordingly, solder bumps 110 having dimensions of 15 μm×15 μm with a height of 3 μm can be bonded to contact structures 100 having of 8 μm×8 μm with a height of 2 μm with limited solder bump spreading to within 50% of a 15 μm distance between contact pad edges.

Figure 4A:
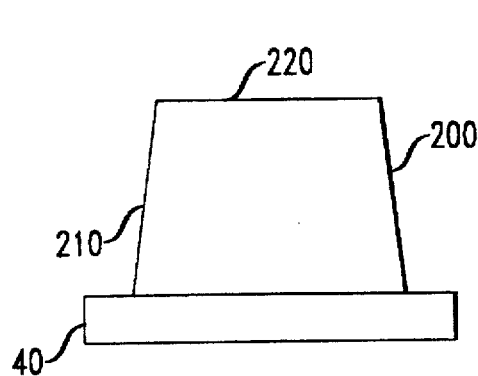
FIG. 4A and 4B illustrate exemplary alternative contact structures than those used in FIG. 2.
Figure 4B:
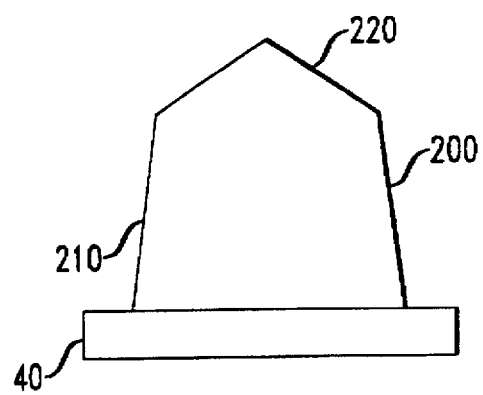

A further reduction in solder bump spreading can be achieved during bonding in accordance with the invention by employing contact structures 200 having at least portion of its side surfaces tapered as indicated by 210 with or without a substantially blunt top 220 as shown in FIGS. 4A and 4B. Exemplary cross-sectional shapes for the contact structures 100 and 200 of FIGS. 1–3, 4A and 4B can include, circular, oval, rectangular or any other shape having a bonding portion with an average cross-sectional area smaller than that of the corresponding solder bumps.

Since a relatively low bonding temperature can be used according to the invention, the occurrence of electrical open circuits due to broken or fractured interconnects as a result of differences in thermal expansion of the substrates would be substantially reduced. However, in order to further reduce the effects of shear forces caused by thermal expansion, it is possible to deposit an epoxy in the volume remaining between the integrated circuits 1 and 50 after the bonds have been created.

Figure 5:
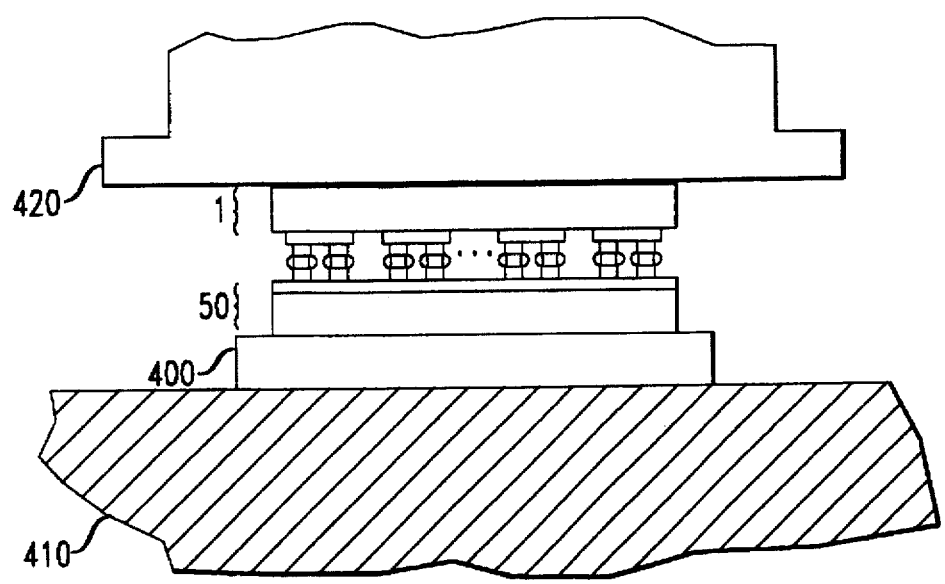
FIG. 5 illustrates the exemplary integrated circuits of FIG. 1 disposed in a thermo-compression bonding apparatus in accordance with an another aspect of the invention.

In accordance with another aspect of the invention, the compression force employed during bonding can more evenly be distributed across the contact pad arrays by using a compliant member 400 such as a rubber sheet in the bonding process, such as that shown in the exemplary arrangement in FIG. 5. Referring to FIG. 5, the CMOS integrated circuit 50 is positioned on a base 410 of a thermo-compression bonding apparatus with the compliant member 400 disposed between the integrated circuit 50 and the base 410. Exemplary bonding apparatus which can be used in accordance with the invention include the M8 Visible Flip Chip Aligner-Bonder manufactured by Research Devices, Piscataway, N.J. The GaAs integrated circuit 1 is then held to a compression member 420 of the bonding apparatus. It is possible to use a sheet of rubber or synthetic compliant material having a thickness in the range of approximately 0.4 mm to 0.5 mm for the compliant member 400.

The GaAs integrated circuit 1 is then positioned over the CMOS integrated circuit 50 such that the respective contact pads are in alignment and the integrated circuits 1 and 50 are subjected to a suitable bonding temperature, and sufficient pressure exerted by the compression member 420 to produce the interconnect bonds according to the invention. The compliant member 400 should be capable of substantially evenly distributing the compression force across the integrated circuits 1 and 50 to form the interconnect bonds without excessive over compression in particular regions of the integrated circuits 1 and 50. The compliant member 400 in combination with contact structures 100 having a height less than that of the corresponding solder bumps advantageously enable the use of wider tolerances in the application of the compression force in the bonding process substantially without a corresponding deleterious effect on the resulting interconnects or the component assembly.

The exact arrangement of the compliant member 400 between the base 410 and the CMOS integrated circuit 50 as well as the GaAs integrated circuit 1 on the compression member 420 is for illustration purposes only. It should be readily understood that the compliant member 400 can alternatively be positioned between the compression member 420 and a component to be bonded.

Although several embodiments of the invention have been described in detail above, many modifications can be made without departing from the teaching thereof. All of such modifications are intended to be encompassed within the following claims. For instance, although the invention has been described with respect to bonding different types of integrated circuits, it is additionally useful in bonding integrated circuits of the same type, or other electrical components, such as integrated circuit packages, multi-chip modules, and PCBs to one another.

The invention claimed is:

1. A method for solder bonding first and second arrays of contact pads to one another comprising the steps of:

providing contact structures on contact pads of said first array;

forming solder bumps on corresponding contact pads of said second array; and bonding said contact structures to said solder bumps, said bonding step achieving a temperature and pressure where the respective solder bumps deform and envelop at least a portion of the respective contact structures, said temperature being below the melting point of the contact structures, wherein each contact structure portion has an average cross-sectional area in a plane parallel to said first array that is less than a corresponding average cross-sectional area of the respective solder bump such that the increase in the solder bump average cross-sectional area resulting from the formed contact structure-solder bump bond is less than 50% of the distance between adjacent bonds.

2. The method of claim 1 wherein said average contact structure cross-sectional area is at most 60% of the corresponding solder bump's average cross-sectional area.

3. The method of claim 1 wherein said bonding step achieves a temperature below the melting point of said solder bumps.

4. The method of claim 3 wherein said contact pads of said first and second array have a dimension at most 20 μm×20 μm with a separation between edges of the adjacent contact pads of at most 20 μm wherein said arrays extend over a distance of at least approximately 1 mm.

5. The method of claim 1 wherein said solder bumps have a height approximately less than 7 μm.

6. The method of claim 1 wherein said contact structures have a height less than a height of the corresponding solder bumps.

7. The method of claim 6 wherein said contact structure height is at most 85% of the corresponding solder bump height.

8. The method of claim 6 wherein said contact structures are used as a compression stop during said bonding step.

9. The method of claim 1 wherein said solder bumps comprise a material selected from the group consisting of tin, gold-plated tin, lead/tin, indium and lead/tin-based alloys.

10. The method of claim 1 wherein said contact structures are at least partially formed of gold.

11. The method of claim 1 wherein said contact structures have tapered outer surfaces.

12. The method of claim 1 wherein said bonding temperature is in the range of 140° C. to 170° C.

13. The method of claim 1 wherein said bonding pressure is in the range of 5 mg/μm² to 7 mg/μm².

14. The method of claim 1 wherein said bonding step further comprises:

providing a compliant member coupled to a component upon which either first or second contact pad array is formed; and applying said pressure through said compliant member to more evenly provide said pressure across said arrays.

15. The method of claim 14 wherein said contact structures have a height less than a height of the solder bumps and wherein said contact structures act as a compression stop.

* * * * *